(12) United States Patent
Rocca et al.

(10) Patent No.: US 10,516,942 B2
(45) Date of Patent: Dec. 24, 2019

(54) ELECTRONIC CIRCUIT FOR A MICROPHONE AND MICROPHONE

(71) Applicant: TDK Corporation, Tokyo (JP)

(72) Inventors: Gino Rocca, Copenhagen (DK); Daifi Haoues Sassene, Vaerlöse (DK); Fabrizio Conso, Frederiksberg (DK); Marco De Blasi, Gentofte (DK); Marco Grassi, Stradella (IT); Piero Malcovati, Pavia (IT); Andrea Baschirotto, Tortona (IT)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/765,539

(22) PCT Filed: Oct. 9, 2015

(86) PCT No.: PCT/EP2015/073416
§ 371 (c)(1),
(2) Date: Apr. 3, 2018

(87) PCT Pub. No.: WO2017/059927
PCT Pub. Date: Apr. 13, 2017

(65) Prior Publication Data
US 2019/0082258 A1 Mar. 14, 2019

(51) Int. Cl.
*H04R 3/00* (2006.01)
*H03M 3/00* (2006.01)
*H04R 3/04* (2006.01)

(52) U.S. Cl.
CPC .............. *H04R 3/04* (2013.01); *H03M 3/394* (2013.01); *H03M 3/398* (2013.01); *H03M 3/414* (2013.01); *H03M 3/458* (2013.01)

(58) Field of Classification Search
CPC ........ H03M 3/39; H03M 3/392; H03M 3/394; H03M 3/398; H03M 3/414; H03M 3/458; H04R 3/00; H04R 3/04
See application file for complete search history.

(56) References Cited

U.S. PATENT DOCUMENTS

| | | | |
|---|---|---|---|
| 6,407,689 B1 | 6/2002 | Bazarjani et al. | |
| 9,681,231 B2 | 6/2017 | Yasuda et al. | |
| 2006/0164274 A1* | 7/2006 | Nakakita | H03M 3/394 341/143 |
| 2008/0272944 A1* | 11/2008 | Zhou | H03M 3/352 341/143 |

(Continued)

FOREIGN PATENT DOCUMENTS

| | | |
|---|---|---|
| JP | 2004529518 A | 9/2004 |
| JP | 2006211045 A | 8/2006 |

(Continued)

*Primary Examiner* — Thang V Tran
(74) *Attorney, Agent, or Firm* — Slater Matsil, LLP

(57) ABSTRACT

An electronic circuit for a microphone and a microphone are disclosed. In an embodiment, the electronic circuit includes a sigma-delta modulator having a configurable resolution and a mode selector, wherein the sigma-delta modulator is selectively operable in at least two operation modes and the mode selector is configured to determine a desired operation mode dependent on an externally provided control signal and to select the resolution of the sigma-delta modulator according to the determined operation mode.

15 Claims, 2 Drawing Sheets

(56) References Cited

U.S. PATENT DOCUMENTS

| | | | |
|---|---|---|---|
| 2009/0066550 A1* | 3/2009 | Hammerschmidt | G01C 19/56 341/143 |
| 2014/0044272 A1* | 2/2014 | Griesdorf | H04R 25/30 381/60 |
| 2014/0167991 A1* | 6/2014 | Oshita | H03M 3/458 341/143 |
| 2015/0058001 A1* | 2/2015 | Dai | H04R 3/00 704/231 |
| 2015/0281836 A1* | 10/2015 | Nguyen | H04R 3/00 381/120 |
| 2015/0295584 A1* | 10/2015 | Das | H03M 1/66 341/154 |
| 2016/0192084 A1* | 6/2016 | Oliaei | H04R 3/06 367/135 |
| 2017/0077946 A1* | 3/2017 | Christen | H03M 3/328 |
| 2018/0063644 A1* | 3/2018 | Bach | H04R 3/06 |

FOREIGN PATENT DOCUMENTS

| | | |
|---|---|---|
| JP | 2009071872 A | 4/2009 |
| JP | 2012039406 A | 2/2012 |
| WO | 2009053949 A1 | 4/2009 |

* cited by examiner

ELECTRONIC CIRCUIT FOR A MICROPHONE AND MICROPHONE

This patent application is a national phase filing under section 371 of PCT/EP2015/073416, filed Oct. 9, 2015 which is incorporated herein by reference in its entirety.

TECHNICAL FIELD

The invention relates to an electronic circuit for a microphone. Furthermore, the invention relates to a microphone comprising the electronic circuit. The microphone may be fabricated in MEMS (micro-electrical-mechanical systems) technology.

BACKGROUND

Digital microphones for modern portable devices like smart phones, tablets, cameras, laptops need to handle different scenarios. For example, the digital microphones are used for recording voice commands as well as high-quality videos. Recording voice commands is a low-performance application with reduced requirements for bandwidth and dynamic range. But the microphone has to run continuously in this case, so that power consumption is critical in terms of not draining a battery of the portable device. In the case of high-quality videos audio quality is most critical while the requirement on power consumption is not so critical.

SUMMARY OF THE INVENTION

Embodiments of the invention provide an electronic circuit and a microphone with a configurable performance and power consumption.

According to a first aspect, the embodiments of invention are distinguished by an electronic circuit for a microphone. The electronic circuit may comprise a sigma-delta modulator having a configurable resolution and a mode selector. The sigma-delta-modulator is selectively operable in at least two operation modes. The mode selector may be configured to determine a desired operation mode dependent on an externally provided control signal and to select the resolution of the sigma-delta modulator according to the determined operation mode.

This has the advantage that the electronic circuit can be reconfigured in a flexible and economical way in terms of chip area requirements, complexity and power consumption. Devices which mainly contribute to chip area requirements and power consumption in the electronic circuit for the microphone are a preamplifier, the sigma-delta modulator and a power management unit comprising, for example, a bandgap, an internal voltage regulator etc. The sigma-delta modulator is designed to work in two or more operation modes. The dynamic range of the sigma-delta modulator can be set to different values depending on the operation mode. The configurable resolution relates to the Signal-to-Noise-Ratio (SNR). The mode selector is configured to determine a desired operation mode dependent on the external control signal and to set the operation mode of the reconfigurable circuit units of the electronic circuit, in particular the sigma-delta modulator. In this way the performance and power consumption may easily be adjusted according to given requirements.

According to an embodiment of the first aspect, the sigma-delta modulator comprises a first sigma-delta modulator and a second sigma-delta modulator, wherein the first sigma-delta modulator and the second sigma-delta modulator are cascadable. In this way different kinds of sigma-delta modulators can easily be configured.

According to a further embodiment of the first aspect, the sigma-delta modulator is operable in a first operation mode and in a second operation mode, wherein in a first operation mode of the sigma-delta modulator only the first sigma-delta modulator or the second sigma-delta modulator is used to provide a digital output signal on an output of the sigma-delta modulator with a resolution of n bits and wherein in a second operation mode of the sigma-delta modulator the first sigma-delta modulator and the second sigma-delta modulator are cascaded such that the digital output signal on the output of the sigma-delta modulator is provided with a resolution of m bits. Herein m is higher than n. In the second operation mode a first output signal provided on the output of the first sigma-delta modulator and a second output signal provided on the output of the second sigma-delta modulator are combined. In this way a higher-order noise shaping may be reached and a higher resolution, of the digital output signal provided on the output of the sigma-delta modulator may be reached in the second operation mode.

According to a further embodiment of the first aspect, the sigma-delta modulator is configured to run in the first operation mode and in the second operation mode with different clock frequencies. This allows for further adjusting the dynamic range and the power consumption of the microphone.

According to a further embodiment of the first aspect, the sigma-delta modulator is configured to run in the first operation mode with a lower clock frequency than in the second operation mode. Thus, the dynamic range and the power consumption in the first operation mode can be further reduced.

According to a further embodiment of the first aspect, the first sigma-delta modulator and the second sigma-delta modulator comprise the same modulator architecture. In this way development and production costs may be reduced.

According to a further embodiment of the first aspect, the electronic circuit comprises a preamplifier for processing an electrical input signal of the electronic circuit. The preamplifier comprises a configurable supply current and is selectively operable in at least two operation modes. The mode selector is configured to select the supply current of the preamplifier according to the determined operation mode. Preferably, the supply current of the preamplifier is lower when the sigma-delta modulator operates in the low resolution mode. This allows for a further adjustment of the dynamic range and the power consumption of the electronic circuit and microphone.

According to a further embodiment of the first aspect, the electronic circuit comprises a configurable power management unit for providing at least one supply voltage to the sigma-delta modulator and/or the preamplifier. The power management unit is configured to provide at least one configurable supply voltage and is selectively operable in at least two operation modes. The mode selector is configured to select at least one supply voltage provided by the power management unit according to the determined operation mode. Preferably, the output supply voltage or supply voltages of the power management unit are lower when the sigma-delta modulator operates in the low resolution mode. This allows for a further adjustment of the dynamic range and the power consumption of the electronic circuit and microphone.

According to a further embodiment of the first aspect, the mode selector comprises a frequency discriminator and the externally provided control signal is a clock signal. This allows for a cost-effective production of the electronic circuit.

According to a further embodiment of the first aspect, the mode selector comprises a memory being configured for setting the resolution of the sigma-delta modulator and/or the supply current of the preamplifier and/or the at least one supply voltage provided by the power management unit.

According to a second aspect, the invention is distinguished by a microphone comprising a transducer (MEMS) and an electronic circuit according to the first aspect.

The electronic circuit may comprise any structural and functional features as described above. Features described with respect to the microphone are also disclosed herein with respect to the electronic circuit and vice versa, even if the respective feature is not explicitly mentioned in the context of the specific aspect.

According to an embodiment of the second aspect, the transducer is fabricated in micro-electrical-mechanical systems technology. The transducer may comprise a capacitor. In particular, an acoustical input signal may result in a change of capacitance of the transducer. Accordingly, the microphone may be a condenser or capacitor microphone. The transducer may comprise a diaphragm and one or more back-plates.

According to a third aspect, the invention is distinguished by a method of operating the microphone according to the second aspect, the method comprising the steps of selecting the first or second mode and operating the microphone in the selected mode.

BRIEF DESCRIPTION OF THE DRAWINGS

Further features, refinements and expediencies will become apparent from the following description of the exemplary embodiments in connection with the figures. These are as follows.

DETAILED DESCRIPTION OF ILLUSTRATIVE EMBODIMENTS

Figure 1:
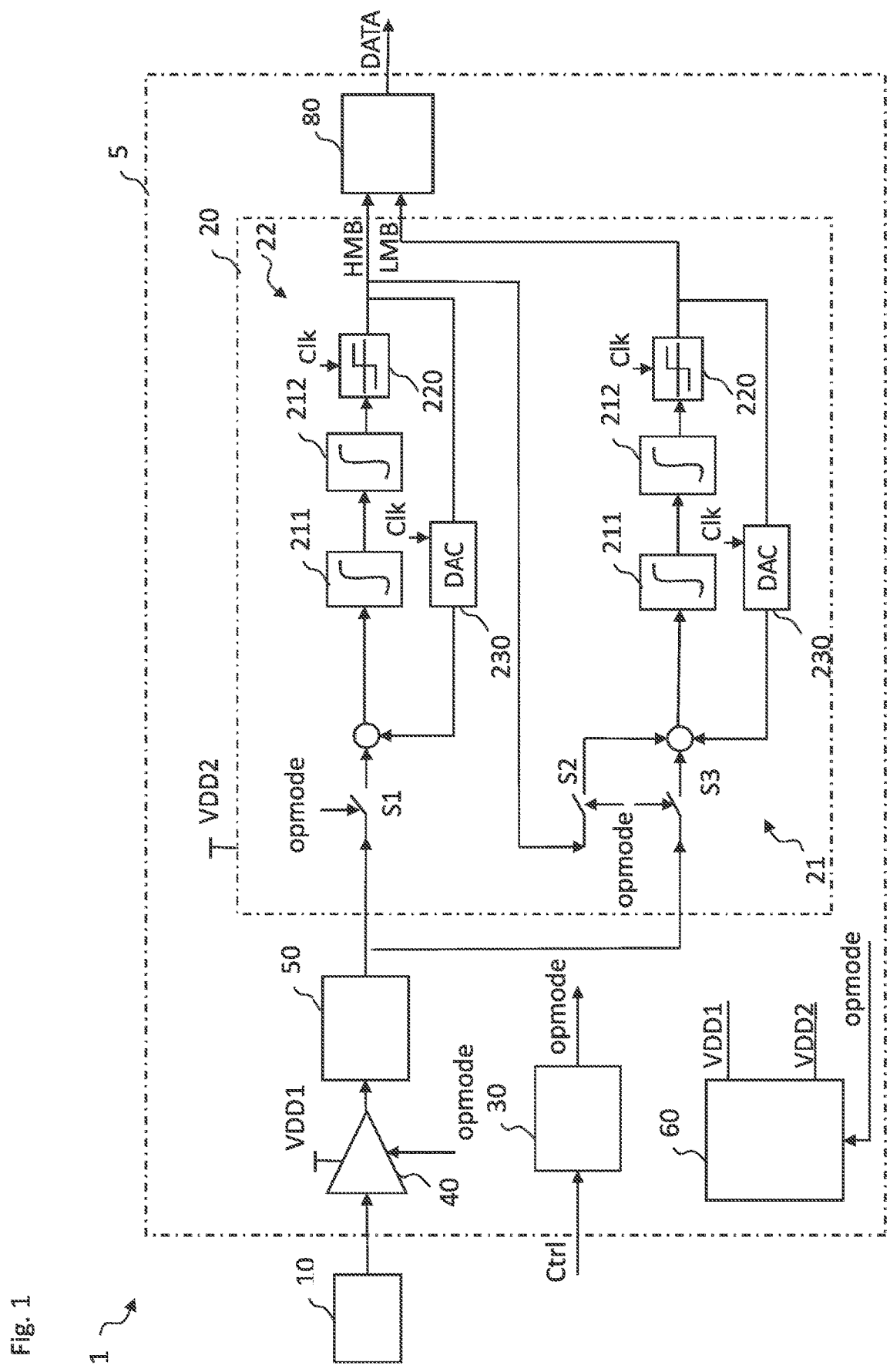
FIG. 1 is a block diagram of a first exemplary embodiment of a microphone.

FIG. 1 shows a schematic diagram of a microphone 1 comprising an electronic circuit 5. The electronic circuit 5 may be an application-specific electronic circuit (ASIC). The electronic circuit 5 may be fabricated as a die.

The microphone 1 may comprise a transducer 10, in particular a MEMS transducer, for converting an acoustical input signal into an electrical signal. As an example, the transducer 10 may comprise a semiconductor material such as silicon or gallium arsenide. The transducer 10 may comprise a diaphragm and one or more back-plates. As an example, the distance between the diaphragm and a back-plate may be in a range of 1 µm to 10 µm. The transducer 10 may be configured as a differential transducer or as a single-ended transducer, for example.

The microphone 1 may comprise a MEMS die and an ASIC die comprising the electronic circuit 5. The shown electronic circuit 5 may also be used with transducers other than a MEMS transducer. The microphone 1 may be used in a headset, for example.

The transducer 10 is electrically connected to the electronic circuit 5. In particular, the electronic circuit 5 may process a signal of the transducer 10.

The electronic circuit 5 comprises, for instance, a preamplifier 40, a filter 50, a sigma-delta modulator 20, a power management unit 60 and a mode selector 30.

The sigma-delta modulator 20 receives a signal, preprocessed by the preamplifier 40 and optionally by the filter 50, from the transducer 10 and provides a digital output signal DATA on an output of the electronic circuit 5.

The sigma-delta modulator 20 comprises a configurable resolution and is selectively operable in at least two operation modes dependent on an externally provided control signal Ctrl.

For instance, the sigma-delta modulator 20 comprises a first sigma-delta modulator 21 and a second sigma-delta modulator 22, wherein the first sigma-delta modulator 21 and the second sigma-delta modulator 22 are cascadable.

The sigma-delta modulator 20 may comprise a multistage noise shaping (MASH) architecture.

The first sigma-delta modulator 21 and the second sigma-delta modulator 22 may each comprise a second order modulator. The first and the second sigma-delta modulator 21, 22 may be configured as a continuous-time sigma-delta modulator comprising a second order continuous-time sigma-delta modulator.

Such a second order continuous-time sigma-delta modulator comprises two modulator stages 211, 212 each with an analog integrator, weighting elements for differently weighting an input signal and a feedback signal and a difference element for providing a difference signal of the input signal and the feedback signal on an input of the analog integrator.

The first sigma-delta modulator 21 and the second sigma-delta modulator 22, for instance, comprise each a clocked quantizer 220 providing a converter output signal on its output and a clocked digital-to-analog converter 230 for providing an analog feedback signal to the input of the respective modulator stages 211, 212.

In a first operation mode of the sigma-delta modulator 20 the sigma-delta modulator 20 is configured such that only the first sigma-delta modulator 21 is used to provide a digital output signal DATA on an output of the sigma-delta modulator 20 with is used to provide a digital output signal DATA on an output of the sigma-delta modulator 20 with a resolution of n bits, wherein the resolution relates to the SNR. In this way a second-order noise shaping with, for instance, a −40 dB/dec slope may be reached.

In a second operation mode of the sigma-delta modulator 20 the sigma-delta modulator 20 is configured such that the second sigma-delta modulator 22 and the first sigma-delta modulator 21 are cascaded such that the digital output signal DATA on the output of the sigma-delta modulator 20 is provided with a resolution of m bits, wherein m is higher than n. In this way a fourth-order noise shaping with, for instance, a −80 dB/dec slope may be reached.

In the second operation mode the resolution of the digital output signal DATA of the sigma-delta modulator 20 is higher than in the first operation mode. In the second operation mode an output of the second sigma-delta modulator 22 is coupled to an input of the first sigma-delta modulator 21. Furthermore, a second output signal HMB provided on the output of the second sigma-delta modulator 22 and a first output signal LMB provided on the output of the first sigma-delta modulator 21 are combined, for example, by a recombination filter 80.

The purpose of the recombination filter is to cancel the quantization noise of the second sigma-delta 22 modulator based on the output of the first sigma-delta 21 modulator.

The first output signal LMB and the second output signal HMB are, for instance, are 1-bit-signals. The number of bits at the output of the recombination filter 80 depends on the operation mode. For instance, in low-mode where the first output signal LMB alone is used, the recombination filter 80 output, equals the recombination filter 80 input. This may be realized by bypassing the recombination filter 80.

In high-mode, the first sigma-delta modulator 21 and second sigma-delta modulator 22 input are both input to the recombination filter 80. But, for instance, the output may be not 2-bit but actually 3-bit as there are 5 output levels, thus requiring 3 bits. This is due to the filtering operation of the recombination filter 80. In high mode the SNR is improved, since the quantization noise of the modulator is 4th order noise shaped by the two 2nd order modulators.

Furthermore, the sigma-delta modulator 20 may be configured to run in the first operation mode and the second operation mode with different clock frequencies. This allows for further adjusting the dynamic range and the power consumption of the microphone 1.

The mode selector 30 of the electronic circuit 5 is configured to select the resolution of the sigma-delta modulator 20 dependent on the externally provided control signal Ctrl.

The preamplifier 40 of the electronic circuit 5 is configured to process an electrical input signal of the electronic circuit 5 provided, for example, by the transducer 10.

Preferably, the preamplifier 40 comprises a configurable supply current and is selectively operable in at least two operation modes dependent on the externally provided control signal Ctrl. In this regard, the mode selector 30 is further configured to select the supply current of the preamplifier 40 dependent on the selected operation mode.

The power management unit 60 is configured for providing at least one supply voltage VDD1, VDD2 to the sigma-delta modulator 20 and/or the preamplifier 40. The power management unit 60 is configured to provide at least one configurable supply voltage VDD1, VDD2 and is selectively operable in at least two operation modes. In this regard, the mode selector 30 is configured to select the at least one supply voltage VDD1, VDD2 provided by the power management unit 60 according to the determined operation mode.

The mode selector 30 may be configured to control a setting of given configuration switches S1, S2, S3 of the electronic circuit 5 by providing a mode control signal opmod dependent on the externally provided control signal Ctrl. The electronic circuit 5 may comprise such configuration switches S1, S2, S3 for coupling and decoupling the first and second sigma-delta modulator 21, 22 and one or more configuration switches in a switched resistor array (not shown in FIG. 1) of the preamplifier 40 for adjusting the supply current of the preamplifier 40.

The electronic circuit 5 and consequently the microphone 1 may be operable in a second mode, which may be a high resolution mode, wherein the resolution of the digital output signal DATA of the sigma-delta modulator 20 is high. Furthermore, the supply current of the preamplifier 40 may be increased, thus generating lower noise and lower distortion. The sigma-delta modulator 20 may by clocked with a higher frequency, for instance 4 MHz. This leads to fourth-order noise shaping and higher SQNR, but also to higher current consumption.

The electronic circuit 5 and consequently the microphone 1 may also be operable in a first mode, which may be a low-power mode, wherein the resolution of the digital output signal DATA of the sigma-delta modulator 20 may be low, and the supply current of the preamplifier 40 may be reduced, for example, to 20% in comparison to the second mode. The sigma-delta modulator 20 may by clocked with a lower frequency, for instance 700 kHz. This leads to second-order noise shaping and low power consumption.

The mode selector 30 may comprise a frequency discriminator, and the externally provided control signal Ctrl may be a clock signal. The frequency discriminator may use a given frequency threshold value for setting the first or the second operation mode. For instance, if the frequency of the clock signal is lower than the given frequency threshold, the mode selector 30 may set the first operation mode. If the frequency of the clock signal is higher than or equal to the given frequency threshold, the mode selector 30 may set the second operation mode.

Figure 2:
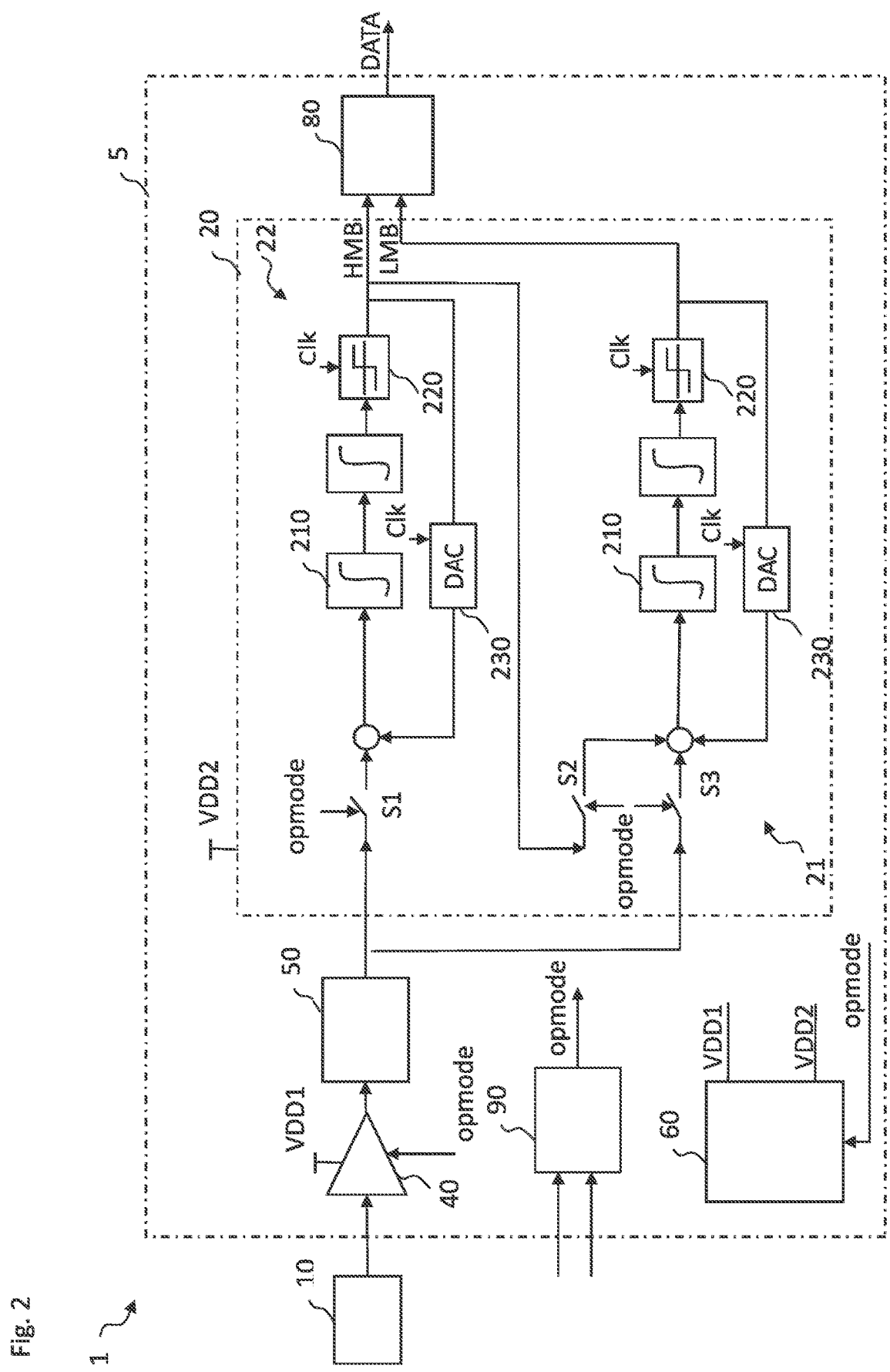
FIG. 2 is a block diagram of a second exemplary embodiment of a microphone.

Alternatively or additionally the mode selector 30 may comprise a memory 90 as shown in FIG. 2. The memory 90 may be configured for setting the electronic circuit 5 in the first or second mode. In particular, the memory 90 may be programmable for selecting one of the modes. The memory 90 is, for instance, configured for setting the resolution of the sigma-delta modulator 20 and/or the supply current of the preamplifier 40 and/or the at least one supply voltage VDD1, VDD2 output by the power management unit 60.

The memory 90 may comprise a control input and a clock input. The memory 90 is programmable by accessing the control input from the outside, in particular via a control pin. Depending on the input signal provided to the control input, the memory 90 switches the electronic circuit 5 to work in a first or second mode. The memory 90, for instance, comprises a one-time programmable memory.

The invention claimed is:

1. An electronic circuit for a microphone, the electronic circuit comprising:
    a sigma-delta modulator having a configurable resolution and a mode selector, wherein the sigma-delta modulator is configured to selectively operate in at least two operation modes and the mode selector is configured to determine a desired operation mode dependent on an externally provided control signal and to select a resolution of the sigma-delta modulator according to the determined operation mode; and
    a preamplifier configured to process an electrical input signal of the electronic circuit, wherein the preamplifier comprises a configurable supply current and is configured to selectively operate in at least two operation modes, and wherein the mode selector is configured to select a supply current of the preamplifier according to the determined operation mode.

2. The electronic circuit according to claim 1, wherein the sigma-delta modulator comprising a first sigma-delta modulator and a second sigma-delta modulator, and wherein the first sigma-delta modulator and the second sigma-delta modulator are cascadable.

3. The electronic circuit according to claim 2,
    wherein the sigma-delta modulator is configured to operate in a first operation mode and in a second operation mode,
    wherein, in the first operation mode of the sigma-delta modulator, only one of the first sigma-delta modulator and the second sigma-delta modulator is operated such that a digital output signal on an output of the sigma-delta modulator is provided with a resolution of n bits, and
    wherein, in the second operation mode of the sigma-delta modulator, the first sigma-delta modulator and the second sigma-delta modulator are cascaded such that the digital output signal on the output of the sigma-delta modulator is provided with a resolution of m bits, wherein m is higher than n.

4. The electronic circuit according to claim 2, wherein the first sigma-delta modulator and the second sigma-delta modulator comprise the same modulator architecture.

5. The electronic circuit according to claim 1, wherein the sigma-delta modulator is configured to run in a first operation mode and in a second operation mode with different clock frequencies.

6. The electronic circuit according to claim 1, wherein the sigma-delta modulator is configured to run in a first operation mode with a lower clock frequency than in a second operation mode.

7. The electronic circuit according to claim 1, wherein the mode selector comprises a memory, wherein the memory is configured to provide instructions for setting the supply current of the preamplifier, and wherein the memory comprises a one-time programmable memory.

8. The electronic circuit according to claim 1, further comprising a configurable power management unit configured to provide at least one supply voltage to the sigma-delta modulator, wherein the power management unit is configured to provide at least one configurable supply voltage and is selectively operate in at least two operation modes, and wherein the mode selector is configured to select at least one supply voltage provided by the power management unit according to the determined operation mode.

9. The electronic circuit according to claim 1, wherein the mode selector comprises a frequency discriminator and the externally provided control signal is a clock signal.

10. The electronic circuit according to claim 1, wherein the mode selector comprises a memory, wherein the memory is configured to provide instructions for setting the resolution of the sigma-delta modulator, and wherein the memory comprises a one-time programmable memory.

11. A microphone comprising:
the electronic circuit according to claim 1; and
a transducer electrically connected to the electronic circuit such that the electronic circuit is configured to process an output signal of the transducer.

12. The microphone according to claim 11, wherein the transducer is a MEMS (Micro-Electrical-Mechanical Systems) device.

13. The microphone according to claim 11,
wherein the electronic circuit further comprises a configurable power management unit configured to provide at least one supply voltage to the sigma-delta modulator,
wherein the power management unit is configured to provide at least one configurable supply voltage and is configured to selectively operate in at least two operation modes, and
wherein the mode selector is configured to select at least one supply voltage provided by the power management unit according to the determined operation mode.

14. A method comprising:
providing the microphone according to claim 11;
selecting a first mode or a second mode of the at least two operation modes of the microphone; and
operating the microphone in the selected mode.

15. A method comprising:
providing a microphone comprising the electronic circuit according to claim 10;
selecting a first mode or a second mode of the at least two operation modes of the microphone; and
operating the microphone in the selected mode.

* * * * *